(12) United States Patent
Jun et al.

(10) Patent No.: US 7,718,530 B2
(45) Date of Patent: May 18, 2010

(54) METHOD FOR MANUFACTURING SEMICONDUCTOR DEVICE

(75) Inventors: Hyun Sook Jun, Incheon (KR); Ki Lyoung Lee, Hwaseong-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 22 days.

(21) Appl. No.: 11/949,391

(22) Filed: Dec. 3, 2007

(65) Prior Publication Data

US 2008/0233726 A1 Sep. 25, 2008

(30) Foreign Application Priority Data

Mar. 19, 2007 (KR) .................. 10-2007-0026672

(51) Int. Cl.
*H01L 21/44* (2006.01)
(52) U.S. Cl. .................. 438/671; 438/717; 438/736; 438/950; 257/E21.039; 257/E21.236
(58) Field of Classification Search .......... 257/E21.039, 257/E21.236; 438/241, 256
See application file for complete search history.

(56) References Cited

U.S. PATENT DOCUMENTS 6,720,256 B1 * 4/2004 Wu et al. .................... 438/638
6,869,899 B2 * 3/2005 Mahorowala et al. ....... 438/587
2003/0034517 A1 2/2003 Chen
2004/0198030 A1 * 10/2004 Buehrer et al. ............. 438/585
2005/0287809 A1 * 12/2005 Lee et al. .................... 438/689
2006/0014351 A1 1/2006 Lo

FOREIGN PATENT DOCUMENTS

| CN | 1722386 A | 1/2006 |
|---|---|---|
| KR | 10-2005-0070320 | 7/2005 |
| KR | 1020030099697 | * 7/2005 |

* cited by examiner

*Primary Examiner*—Charles D Garber
*Assistant Examiner*—Yasser A Abdelaziez
(74) *Attorney, Agent, or Firm*—Marshall, Gerstein & Borun LLP

(57) ABSTRACT

A method for manufacturing a semiconductor device includes forming a gate conductive layer, a first mask layer, a second mask layer, and a third mask layer over a semiconductor substrate that includes a cell region and a peripheral region. The method also includes forming a second mask pattern and a third mask pattern using a gate mask. The method further includes trimming the second mask pattern in the peripheral region to form a fourth mask pattern having a size smaller than that of the second mask pattern. Still further, the method includes removing the third mask pattern, and patterning the first mask layer and the gate conductive layer using the fourth mask pattern as a mask.

12 Claims, 7 Drawing Sheets

METHOD FOR MANUFACTURING SEMICONDUCTOR DEVICE

CROSS-REFERENCE TO RELATED APPLICATION

Priority to Korean patent application No. 10-2007-0026672 filed on Mar. 19, 2007, the disclosure of which is incorporated by reference in its entirety, is claimed.

BACKGROUND OF THE INVENTION

1. Field of Invention

The invention generally relates to a semiconductor device. More particularly, the invention relates to a method for forming a gate in a semiconductor device.

2. Brief Description of Related Technology

As a design rule of a semiconductor device is decreased, a numerical aperture and a wavelength (λ) of a light source are increased to form a fine pattern. The exposure condition is advantageous in a cell region during a gate formation, but it is difficult to secure a depth of focus ("DOF") margin in a peripheral region so that there is a limitation on regulation of a gate critical dimension ("CD"). A trimming process is performed while the peripheral region is exposed, thereby independently controlling the gate CD over the cell region.

It is necessary to control the CD within 1 nanometer (nm) to pattern a CD of 45 nm, which is the minimum gate CD in devices beyond 65 nm. As a result, a photoresist trimming process is required. The trimming process reduces a width of the photoresist film by a dry etching method to define a desired width of a fine pattern.

However, because it is difficult to apply the trimming process in practice, the gate CD is adjusted with a mask. The mask includes an amorphous carbon material to improve durability and minimize loss resulting from a strip process.

SUMMARY OF THE INVENTION

Embodiments of the present invention are directed to a method of making a semiconductor device. According to an embodiment of the present invention, a semiconductor device is manufactured with a trimming technology so as to control a gate CD in a peripheral region, thereby simplifying the fabrication process.

According to an embodiment of the present invention, a method for manufacturing a semiconductor device includes forming a gate conductive layer, a first mask layer, a second mask layer and a third mask layer over a semiconductor substrate, wherein the substrate includes a cell region and a peripheral region. A second mask pattern and a third mask pattern are formed using a gate mask. The second mask pattern in the peripheral region is trimmed to form a fourth mask pattern, the fourth mask pattern having a size that is smaller than the size of the second mask pattern. The third mask pattern is removed. The first mask layer and the gate conductive layer are patterned using the fourth mask pattern as a mask.

Additional features of the disclosed invention may become apparent to those skilled in the art from a review of the following detailed description, taken in conjunction with the drawings, and the appended claims.

BRIEF DESCRIPTION OF THE DRAWINGS

For a more complete understanding of the disclosure, reference should be made to the following detailed description and accompanying drawings wherein.

Figure 1A:
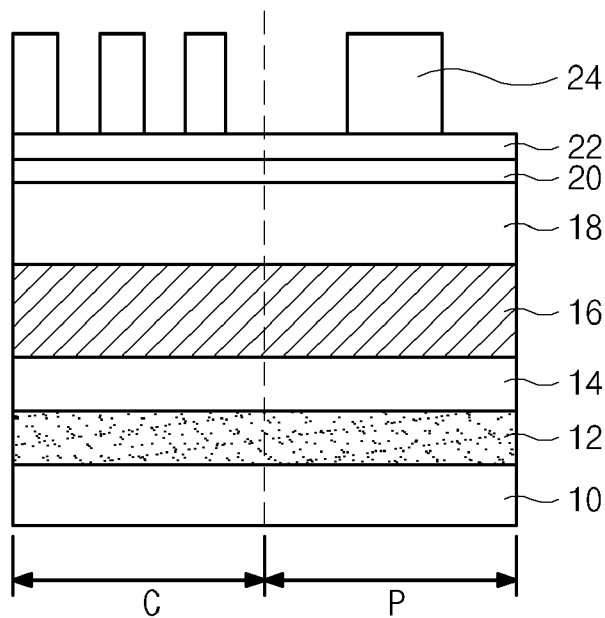
FIGS. 1a to 1f are cross-sectional views illustrating a method for manufacturing a semiconductor device according to an embodiment of the present invention.

While the disclosed method is susceptible of embodiments in various forms, there are illustrated in the drawings (and will hereafter be described) specific embodiments of the invention, with the understanding that the disclosure is intended to be illustrative, and is not intended to limit the invention to the specific embodiments described and illustrated herein.

DESCRIPTION OF EMBODIMENTS

FIGS. 1a to 1f are cross-sectional views illustrating a method for manufacturing a semiconductor device according to an embodiment of the present invention. A device isolating film (not shown) is formed over a semiconductor substrate 10 including a cell region C and a peripheral region P to define an active region (not shown). A gate oxide film (not shown) is formed over the active region of the semiconductor substrate 10.

The semiconductor substrate 10 in the cell region C is doped with N-type impurities. The semiconductor substrate 10 in the peripheral region P is doped with P-type impurities. A gate polysilicon layer 12, a gate electrode layer 14, a first mask layer 16, a second mask layer 18, a third mask layer 20 and an anti-reflection film 22 are formed over the gate oxide film.

Preferably, the first mask layer 16 includes a nitride film; the second mask layer 18 includes an amorphous carbon layer; and the third mask layer 20 includes a silicon oxynitride (SiON) film. A first photoresist pattern 24 is formed over anti-reflection film 22 to define a gate region.

Figure 1B:
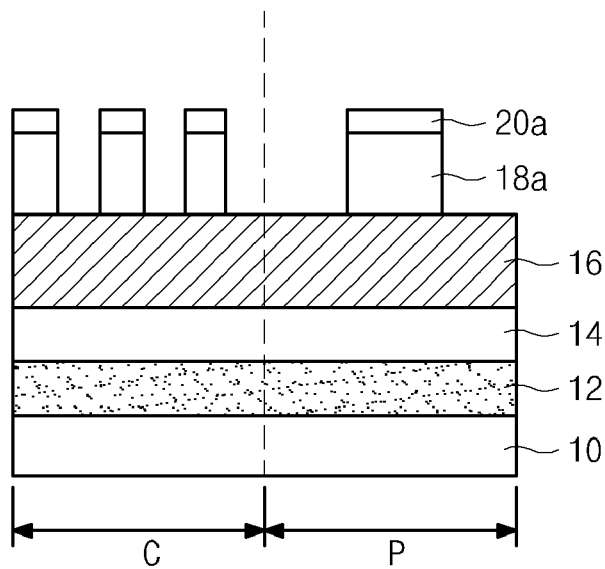

Referring to FIG. 1b, the anti-reflection film 22, the third mask layer 20, and the second mask layer 18 are etched using the first photoresist pattern 24 as a mask to form an anti-reflection pattern (not shown), a third mask pattern 20a and a second mask pattern 18a. The first photoresist pattern 24 and anti-reflection pattern are then removed.

Figure 1C:
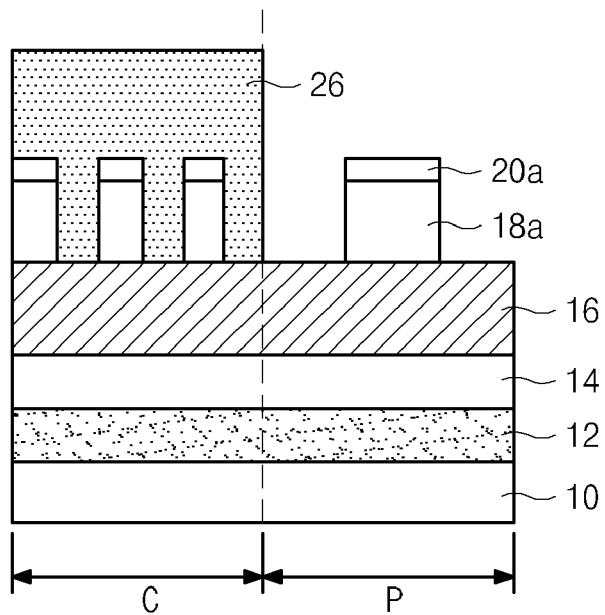
Figure 1D:
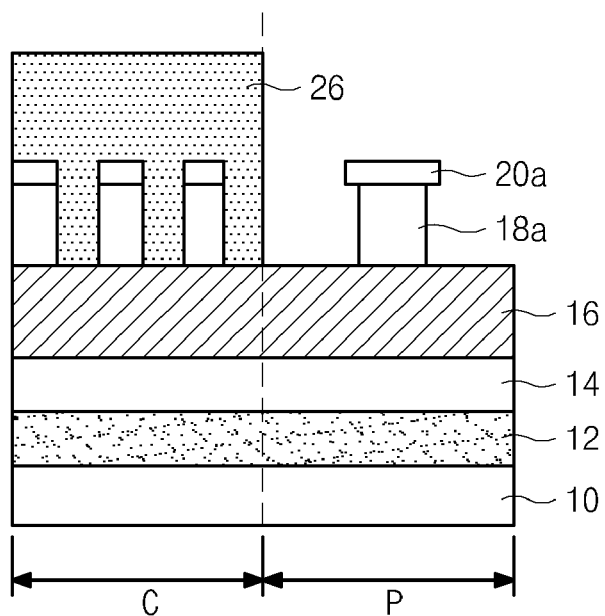
Figure 1E:
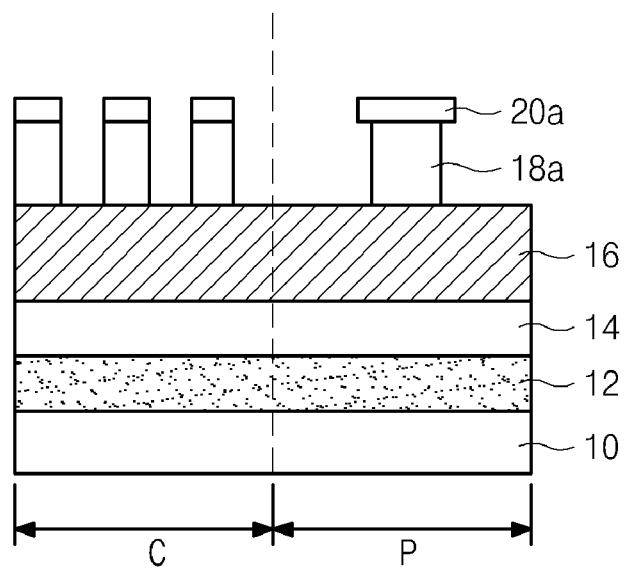

Referring to FIGS. 1c to 1e, a second photoresist film (not shown) is formed over the resulting structure. The second photoresist film is exposed and developed using a cell isolation mask to form a second photoresist pattern 26. A trimming process is performed on the second mask pattern 18a to reduce a critical dimension ("CD") to a desired gate CD. Second photoresist pattern 26 is then removed.

Figure 1F:
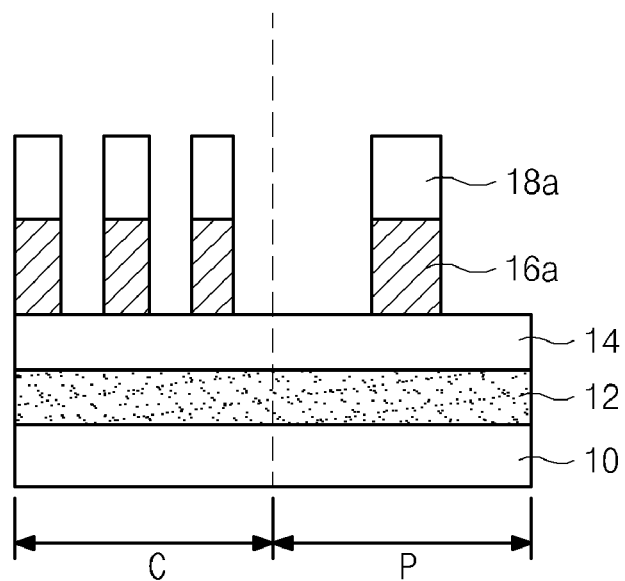

Referring to FIG. 1f, the first mask layer 16 is etched using the second mask pattern 18a and the third mask pattern 20a as a mask to form a first mask pattern 16a. The third mask pattern 20a is then removed. The gate electrode layer 14 and the gate polysilicon layer 12 are patterned using the first mask pattern 16a and second mask pattern 18a as a mask to obtain a gate.

However, in the above-described method, because an amorphous carbon layer is used as a mask layer (in the second mask pattern 18a), a chemical vapor deposition ("CVD") process is performed to form the amorphous carbon layer, which results in increased process costs. Because the amorphous carbon layer has poor step coverage, a SiON film is additionally formed as a mask layer (in the third mask pattern 20a) so that the process is complicated.

FIGS. 2a to 2f are cross-sectional views illustrating a method for manufacturing a semiconductor device according to another embodiment of the present invention. A device isolating film (not shown) is formed over a semiconductor substrate 100, the substrate 100 including a cell region C and a peripheral region P, to define an active region. A gate oxide film (not shown) is formed over the active region of the semiconductor substrate 100.

The semiconductor substrate 100 in the cell region C is doped with N-type impurities. The semiconductor substrate 100 in the peripheral region P is doped with P-type impurities. A gate conductive layer 105 and a first mask layer 106 are formed over the gate oxide film. The gate conductive layer 105 includes, in a stacked formation, a gate polysilicon layer 102 and a gate electrode 104. The gate electrode layer 104 preferably includes a material or film selected from the group consisting of a tungsten (W) layer, a tungsten nitride (WN) film, and a combination thereof. The first mask layer 106 preferably includes a nitride film. A second mask layer 108, and a third mask layer 110 are formed over first mask layer 106.

A spin-on-coating ("SOC") process is performed with a polymer film over the first mask layer 106. The polymer film is baked to form second mask layer 108. The polymer film preferably includes a novolak resin containing carbon (C) of about 90 wt %, based on the total weight of the polymer film. An SOC process is performed with a material preferably containing silicon (Si) of at least 25% over the second mask layer 108. The polymer film is baked to form the third mask layer 110. The third mask layer 110 serves as a mask and a bottom anti-reflective coating ("BARC") film.

The second mask layer 108 and the third mask layer 110 are cross-linked at a baking temperature greater than the temperature at which a photoresist film is formed so that the second mask layer 108 and third mask layer 110 may not be removed by an organic solution when a second photoresist pattern 114 is removed. For example, the baking temperature is higher than the photoresist forming temperature by a temperature in the range of about 10° C. to 20° C. A first photoresist pattern 112 is formed over third mask layer 110 to define a gate region.

Figure 2A:
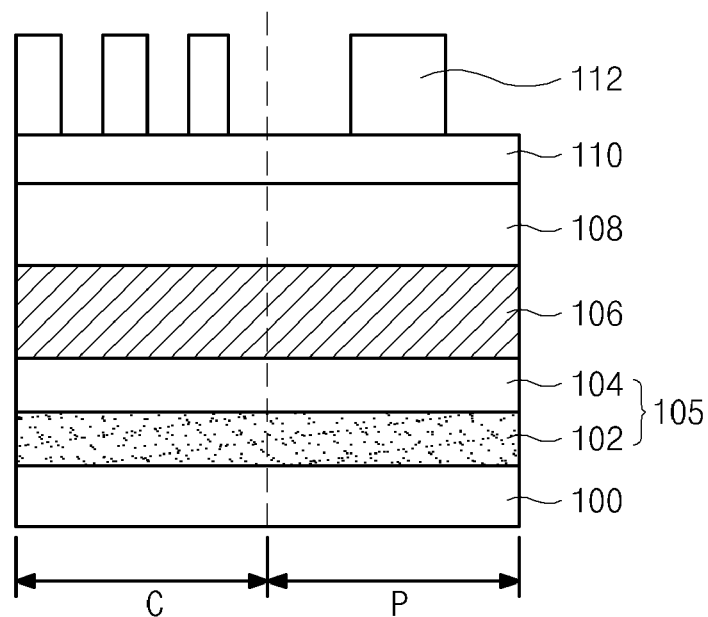
FIGS. 2a to 2f are cross-sectional views illustrating a method for manufacturing a semiconductor device according to another embodiment of the present invention.
Figure 2B:
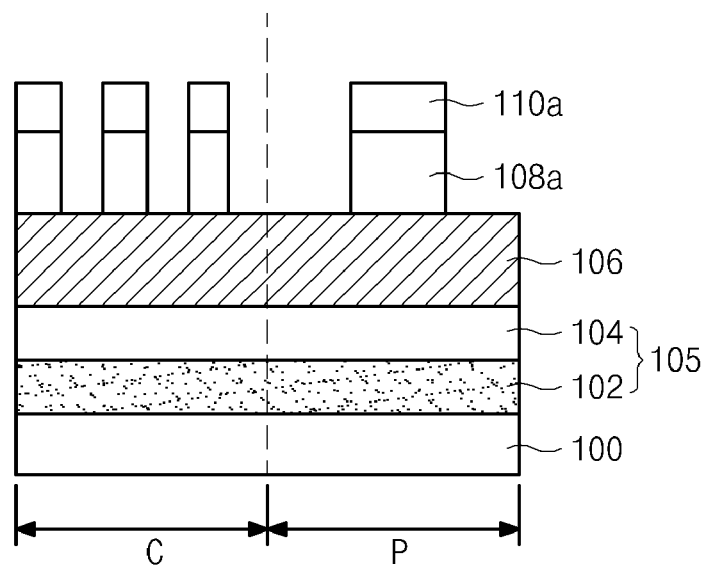

Referring to FIG. 2b, the third mask layer 110 is etched using the first photoresist pattern 112 as a mask to form a third mask pattern 110a. The third mask layer 110 preferably is dry etched using a source gas that preferably includes a gas selected from the group consisting of $CHF_3$, $CF_4$, and a combination thereof. The second mask layer 108 is etched using the third mask pattern 110a as a mask to form a second mask pattern 108a. The second mask layer 108 preferably is dry etched using a source gas that preferably includes a gas selected from the group consisting of $O_2$, $N_2$, $H_2$, and combinations thereof. The first photoresist pattern 112 is then removed.

Figure 2C:
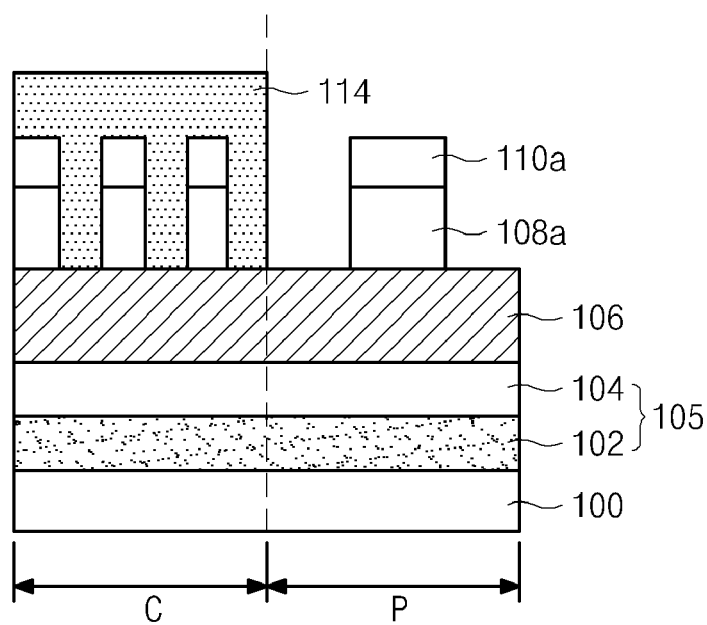

Referring to FIG. 2c, a second photoresist film (not shown) is formed over the first mask layer 106, the second mask pattern 108a, and the third mask pattern 110a. The second photoresist film is exposed and developed with a cell blocking mask to form a fifth mask pattern 114. The second photoresist film includes a photoresist film for I-line. The second photoresist film is preferably formed to have a thickness in a range of about 900 Å to about 1100 Å from a top of the third mask pattern 110a to a top of the fifth mask pattern 114 in order not to etch the second photoresist film during a subsequent trimming process, whereby the third mask pattern 110a of the cell region C may not be exposed.

Figure 2D:
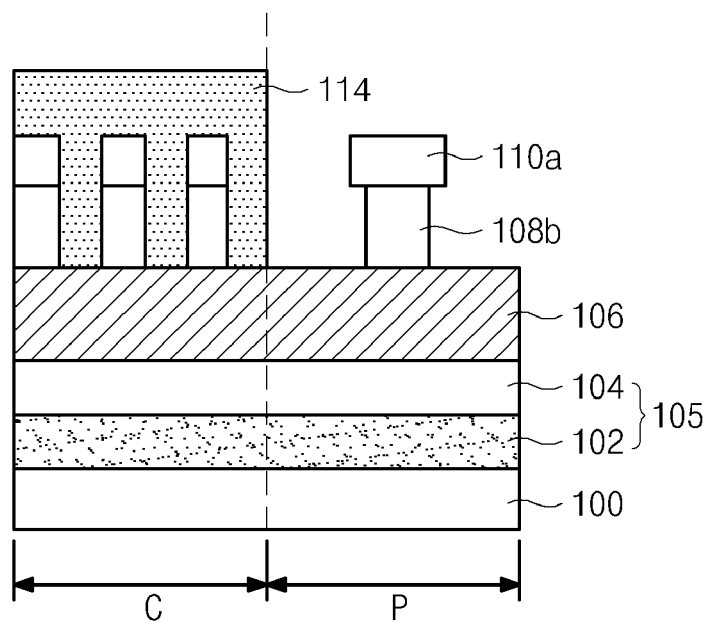
Figure 2E:
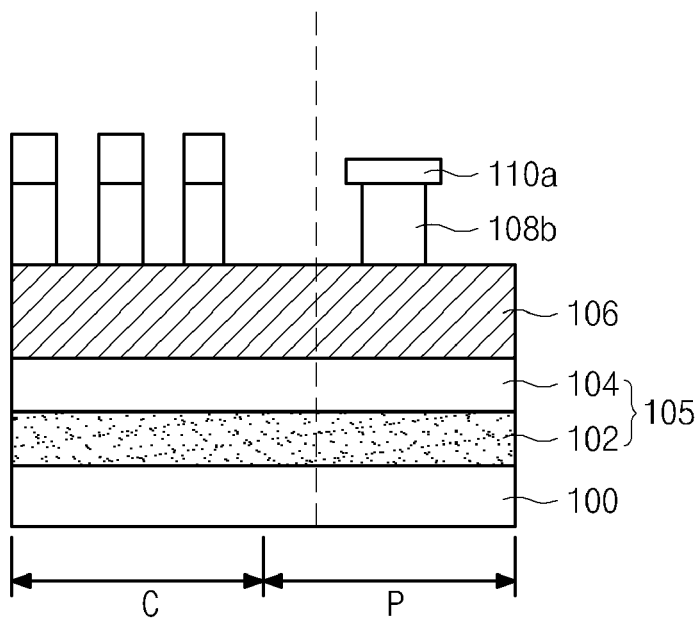

Referring to FIGS. 2d and 2e, the trimming process is performed on the second mask pattern 108a to form a second mask pattern 108b, thereby reducing a CD of the second mask pattern 108a of FIG. 2c to a desired gate CD. A size of the trimmed second mask pattern 108b is smaller than that of the second mask pattern 108a. The second mask pattern 108a preferably is dry etched using a source gas that includes a gas selected from the group consisting of $O_2$, $N_2$, and a combination thereof. The fifth mask pattern 114 is then removed. The fifth mask pattern 114 may be removed using a thinner organic solvent as a developing solution.

Figure 2F:
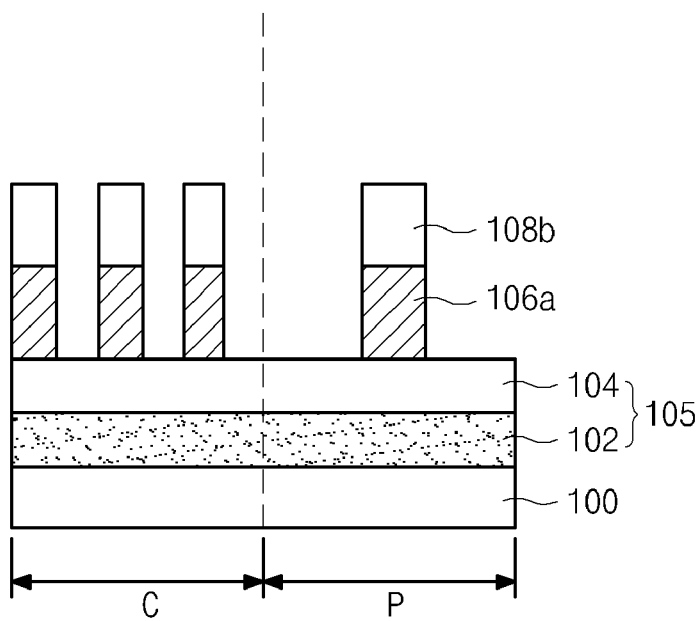

Referring to FIG. 2f, the first mask layer 106 is etched using the second mask pattern 108b and the third mask pattern 110a as a mask to form a first mask pattern 106a. The first mask layer 106 preferably is dry etched using a source gas that preferably includes a gas selected from the group consisting of $CF_4$, $CHF_3$, and a combination thereof. The third mask pattern 110a is then removed. The gate conductive layer 105 is etched using the first mask pattern 106a and the second mask pattern 108b as a mask to obtain a gate.

Figure 3:
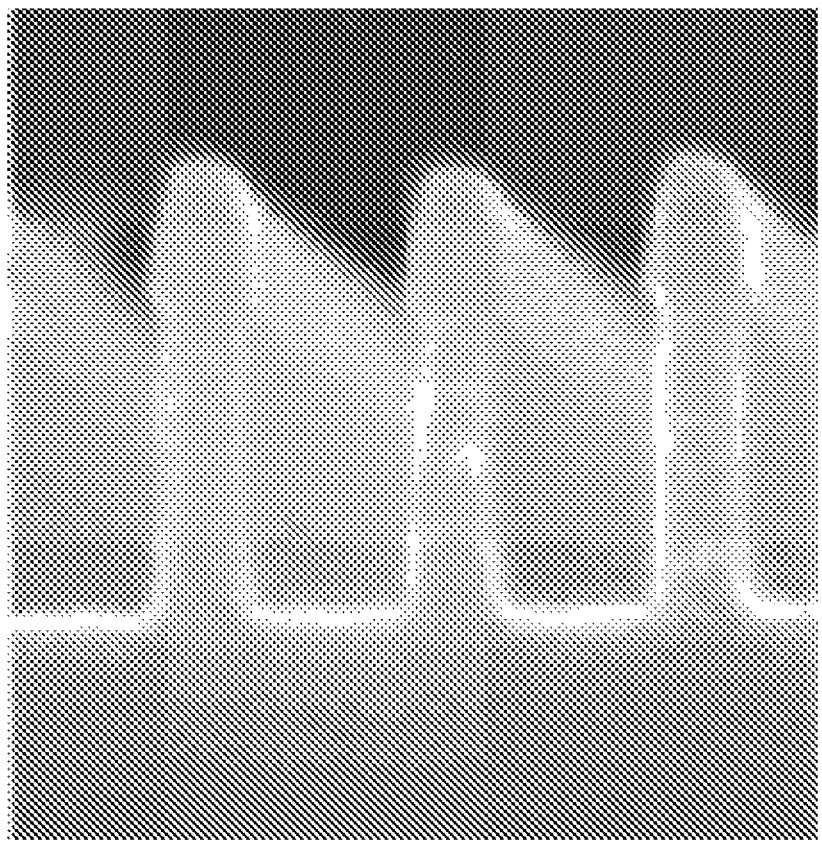
FIG. 3 is a photograph illustrating mask patterns of FIG. 2d.

FIG. 3 is a photograph illustrating the second mask pattern 108b and the third mask pattern 110a of FIG. 2d. The second mask pattern 108b and the third mask pattern 110a have excellent step coverage and a strong etch resistance so that the trimming process can be effectively performed.

As described above, according to an embodiment of the present invention, a method for manufacturing a semiconductor device includes performing a trimming process to adjust the gate CD of a peripheral region with a polymer film and a mask layer containing silicon, and performing a spin-on-coating method instead of a chemical vapor deposition ("CVD") method to reduce process cost. Moreover, it is unnecessary to form an anti-reflection film, thereby simplifying the process.

The foregoing description is provided for clearness of understanding only, and no unnecessary limitations should be understood therefrom as modifications within the scope of the invention may be apparent to those having ordinary skill in the art. The invention is not limited by the lithography steps described herein. Nor is the invention limited to any specific type of semiconductor device. For example, the present invention may be implemented in a dynamic random access memory (DRAM) device or non volatile memory device.

What is claimed is:

1. A method for manufacturing a semiconductor device, the method comprising:
   forming a gate conductive layer, a first mask layer, a second mask layer comprising a polymer film, and a third mask layer comprising a silicon (Si) layer over a semiconductor substrate, the substrate including a cell region and a peripheral region;
   baking the semiconductor substrate including the mask layers so that the second mask layer and the third mask layer are cross-linked;
   forming a second mask pattern and a third mask pattern using a gate mask;
   trimming the second mask pattern in the peripheral region to form a fourth mask pattern, the fourth mask pattern having a size smaller than that of the second mask pattern;
   removing the third mask pattern; and,
   patterning the first mask layer and the gate conductive layer using the fourth mask pattern as a mask.

2. The method of claim 1, wherein the first mask layer comprises a nitride film.

3. The method of claim 1, wherein the polymer film comprises a novolak resin.

4. The method of claim 1, wherein the second mask layer and the third mask layer are formed by a spin-on-coating method.

5. The method of claim 1, wherein the process of forming the third mask pattern is performed by dry etching with a source gas comprising a gas selected from the group consisting of $CHF_3$, $CF_4$, and combinations thereof.

6. The method of claim 1, wherein the process of forming the second mask pattern is performed by dry etching with a source gas comprising a gas selected from the group consisting of $O_2$, $N_2$, $H_2$, and combinations thereof.

7. The method of claim 1, wherein the trimming process is performed by dry etching with a source gas comprising a gas selected from the group consisting of $O_2$, $N_2$, and combinations thereof.

8. The method of claim 1, wherein the trimming process includes:
    selectively exposing the peripheral region over the third mask pattern to form a fifth mask pattern;
    performing a trimming process to reduce the size of the second mask pattern; and
    removing the fifth mask pattern.

9. The method of claim 8, wherein the fifth mask pattern is an I-line photoresist film.

10. The method of claim 8, wherein the fifth mask pattern has a thickness of about 900 Å to about 1,100 Å, the thickness measured from a top surface of the third mask pattern to a top surface of the fifth mask pattern.

11. The method of claim 1, wherein the process of patterning the first mask layer is performed by dry etching with a source gas comprising a gas selected from the group consisting of $CF_4$, $CHF_3$, and a combinations thereof.

12. The method of claim 1, wherein the gate conductive layer is a material layer selected from the group consisting of a polysilicon layer, a tungsten (W) layer, a tungsten nitride (WN) film, and combinations thereof.

* * * * *